United States Patent [19]

Kabacoff et al.

[11] Patent Number: 4,965,139
[45] Date of Patent: Oct. 23, 1990

[54] CORROSION RESISTANT METALLIC GLASS COATINGS

[75] Inventors: Lawrence T. Kabacoff, Columbia, Md.; William Ferrando, Arlington, Va.

[73] Assignee: The United States of America as represented by the Secretary of the Navy, Washington, D.C.

[21] Appl. No.: 486,655

[22] Filed: Mar. 1, 1990

[51] Int. Cl.$^5$ .............................................. B32B 15/18
[52] U.S. Cl. .................................. 428/682; 428/684; 428/685; 428/938; 148/403
[58] Field of Search ............... 428/681, 682, 683, 684, 428/685, 938; 148/403; 204/142.16

[56] References Cited

U.S. PATENT DOCUMENTS

| Re. 29,989 | 5/1979 | Polk et al. | 148/403 |
|---|---|---|---|
| 4,122,240 | 10/1978 | Banas et al. | 148/403 |
| 4,496,635 | 1/1985 | Wang et al. | 428/681 |
| 4,515,870 | 5/1985 | Bose et al. | 428/684 |
| 4,555,186 | 11/1985 | Scruggs | 148/403 |
| 4,725,512 | 2/1988 | Scruggs | 428/681 |
| 4,743,513 | 5/1988 | Scruggs | 148/403 |
| 4,834,806 | 5/1989 | Hashimoto | 148/403 |
| 4,851,296 | 7/1989 | Tenhover et al. | 428/681 |
| 4,863,810 | 9/1989 | Bhattacharya et al. | 148/403 |
| 4,880,482 | 11/1989 | Hashimoto et al. | 148/403 |
| 4,906,306 | 3/1990 | Araki et al. | 148/403 |

FOREIGN PATENT DOCUMENTS

| 56-41349 | 4/1981 | Japan | 428/682 |
|---|---|---|---|
| 60-154602 | 8/1985 | Japan | 428/682 |
| 61-91355 | 5/1986 | Japan | 428/681 |
| 63-312965 | 12/1988 | Japan | 204/192.16 |
| 1-96379 | 4/1989 | Japan | 204/192.16 |
| 1-96380 | 4/1989 | Japan | 204/192.16 |

OTHER PUBLICATIONS

R. B. Diegle et al., "Corrosion Behavior of Glassy Chromium-Containing Alloys Prepared by Sputtering", J. Electrochemical Society, vol. 127, Sep. 1980, pp. 2030-2033.

Primary Examiner—John J. Zimmerman
Attorney, Agent, or Firm—Kenneth E. Walden; Roger D. Johnson

[57] ABSTRACT

Corrosive-resistant, amorphous metal alloy coatings for crystalline metal surfaces wherein the coating is formed by vapor deposition of a mixture of (1) from 8 to 30 atomic percent of boron, silicon, or mixtures thereof and
(2) the remainder being a modified metal composition formed by modifying the composition of the crystalline metal of the surface to produce a final amorphous metal alloy coating that is anodic in reference to the crystalline metal of the surface.

27 Claims, 2 Drawing Sheets

CORROSION RESISTANT METALLIC GLASS COATINGS

BACKGROUND OF THE INVENTION

This invention relates to amorphous metal alloys and particularly to amorphous metal alloy coatings for protecting metals against corrosion.

Metallic glasses are relatively new materials that are produced in the form of ribbons, wires, or coatings by rapid solidification from either the liquid or vapor state. They are truly noncrystalline alloys which combine the properties of a metal (electrical conductivity, metallic luster, etc.) with the lack of long range order typical of a glass. They are very homogeneous and lack the defects typical of a crystalline material, such as grain boundaries and dislocations.

There are a large number of alloy systems which will form metallic glasses. The best known metallic glasses combine late transition metals with metalloids such as boron, carbon, silicon, and phosphorus. Because of the lack of stoichiometric requirements, the composition of a metallic glass can be varied continuously within certain limits. Thus, the properties of a metallic glass can be tailored over a wide range to optimize various properties.

The outstanding corrosion resistance of some metallic glasses derives from two sources. The complete lack of microstructure leads to a particularly homogeneous passive film with no underlying defects to serve as pitting sites. In addition, the surface of an amorphous solid has a higher free energy than the surface of the corresponding crystalline solid leading to more aggressive passivation. It should be noted that if the metallic glass lacks elements that form a passive film, such as chromium or aluminum, the higher reactivity of the surface results in a corrosion resistance which is poorer than that of the corresponding crystalline material. If, however, the appropriate element is present, metallic glasses produce a higher quality protective film than that of a crystalline material with similar composition.

The outstanding corrosion properties of metallic glasses have led to several research efforts aimed at producing corrosion resistant coatings on metallic substrates. These include Mo-Ru-B, USN S30400 stainless steel (304SS) with small additions of carbon, Mo-Cr-B, and a sputtered version of Metglas ® 2826A. Procedures for fabricating highly corrosion-resistant metallic glass coatings are now very well established. The method of choice is usually magnetron sputtering, an industrially mature process which is characterized by high deposition rate and excellent film adhesion. Recently, amorphous metal coatings also have been produced by electroless deposition.

There are a number of situations in which a metallic glass coating would have a distinct advantage over other types of corrosion protection. Amorphous metal coatings would be especially useful in cases where the coating must be electrically conductive (e.g., electrical contacts) or where the dimension of the work-piece must remain unchanged within a certain tolerance. Another major advantage of metallic glasses is that because they have no grain boundaries or defects, they tend to make excellent barriers to permeation of various corrosive substances such as fuel components. Such permeation can cause severe corrosion problems.

Unfortunately, a small pinhole or scratch often results in the severe corrosion and catastrophic failure of the underlying crystalline metal structure material. It would therefore be desirable to provide corrosion-resistant coatings that could have pinholes, cracks, or scratches and still protect the underlying crystalline metal material from major corrosion.

SUMMARY OF THE INVENTION

Accordingly, an object of this invention is to provide new corrosive resistant coatings for iron or steel structures.

Another object of this invention is to provide new corrosion resistant amorphous metal alloy coatings for iron or steel structures.

A further object of this invention is to provide corrosive resistant amorphous metal alloy coatings whose compositions are tailored to the composition of the iron or steel structure.

Yet another object of this invention is to prevent catastrophic corrosive failure of the iron or steel structures when cracks, scratches, or chips occur in the amorphous metal alloy protective coating.

A still further object of this invention is to provide superior corrosion resistant coatings for iron and steel materials in salt water environments.

These and other objects of this invention are accomplished by providing amorphous metal alloy coatings for crystalline metal surfaces wherein the coating is formed by vapor deposition of a mixture of (1) from 8 to 30 atomic percent of boron, silicon, or mixtures thereof and (2) the remainder being a modified metal composition formed by modifying the composition of the crystalline metal to produce a final amorphous metal alloy coating that is anodic in reference to the crystalline metal of the surface.

When the crystalline metal of the surface is a iron-chromium or iron-chromium-nickel alloy containing 4 or more weight percent of chromium, the modified metal composite is formed by reducing the nickel, chromium, or nickel-chromium content by from more than zero to 3 weight percent.

When the crystalline metal of the surface is an iron material containing less than 4 weight percent chromium, such as a cast iron, a carbon steel, a low-carbon steel, an alloy steel or a low-alloy, the modified metal composite is formed by replacing from more than zero to 25 weight percent of the crystalline metal with aluminum.

Figure 1:
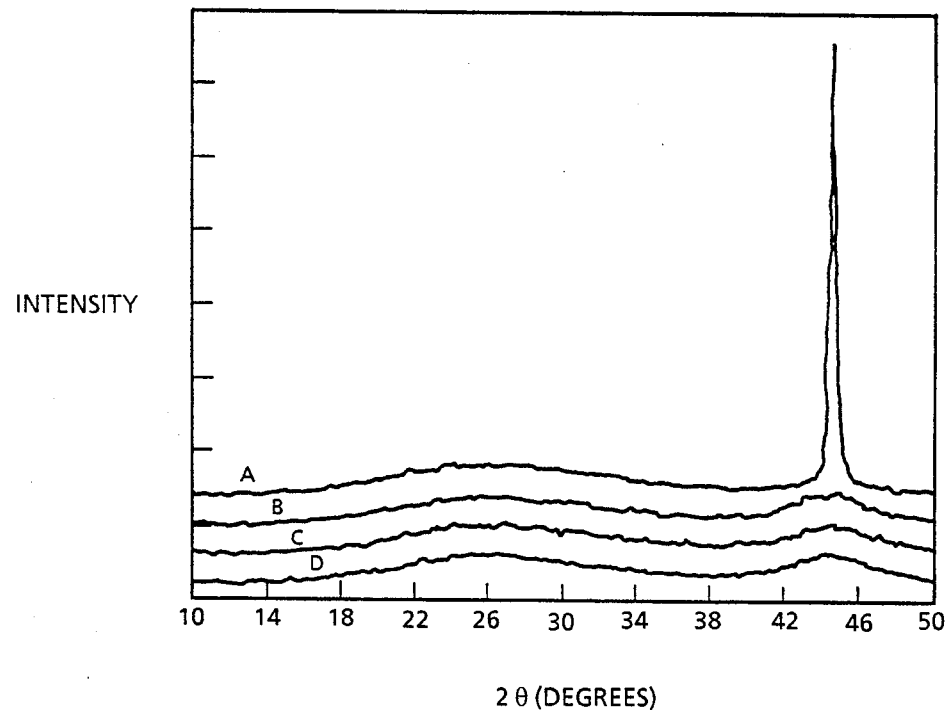
FIG. 1 shows the X-ray diffraction patterns for a series of amorphous metal alloy coating formed by magnetron sputtering using a direct current (DC) target of USN S30400 iron-chromium stainless steel and a radio frequency (RF) target of boron and silicon.

These figures are discussed in more detail in the examples.

DETAILED DESCRIPTION OF THE PREFERRED EMBODIMENT

Corrosion-resistant amorphous metal alloy coatings are provided for two groups of iron crystalline metal materials. The first group contains those iron alloys composed of 4 or more weight percent of chromium. This group includes the stainless steels which are defined by the American Iron and Steel Institute as containing 4 or more weight percent of chromium. Preferred are the iron-chromium and the iron-chromium-nickel stainless steels. Also included in this first group are the iron-chromium and iron-chromium-nickel casting alloys containing 4 or more weight percent of chromium.

The second group of iron crystalline metal materials which may be protected by the coatings of this invention are those metals and alloys containing less than 4 weight percent of chromium. Examples of these materials include cast irons, carbon steels, low carbon steels, alloy steels, and low alloy steels.

The amorphous metal alloy (metallic glass) coatings are prepared from a mixture of metalloids and a slightly modified version of the iron or steel crystalline bulk material of the exposed surface or substrate to be coated. Conventionally the metalloids phosphorus, carbon, boron, and silicon are used with iron to form amorphous metal alloys. In the present case, however, phosphorus is unsuitable because it is strongly electronegative and will strongly affect the electronegativity amorphous metal alloy coating. Carbon is difficult to sputter and is more electrochemically active than boron or silicon. Surprisingly, boron and silicon are not only good glass formers suitable for sputtering, but they also have little or no effect on the electronegativity of the amorphous metal alloy. Therefore boron, silicon, or mixtures of both are used in the protective coatings of this invention. The metalloids will preferably comprise from 8 to 30, more preferably from 15 to 25, and still more preferably form 18 to 22 atomic percent of the total metalloid/metal alloy coating composition, with the metals being the remainder. Differential scanning calorimetry (DSC) measurements show that when the amorphous metal alloy coating is deficient in metalloid, excess metal is precipitated out, leaving behind a stable amorphous matrix which then crystallizes at a higher temperature. Since chromium is a much poorer glass former than either iron or nickel, we have shown by x-ray photoelectron spectroscopy (XPS) measurements that it precipitates preferentially from the coatings for iron-chromium and iron-chromium-nickel steels. This will result in a coating with crystalline inclusions, which provide sites for corrosive attack. DSC measurements indicate that boron migrates to the surface of amorphous metal alloy coatings having an excess of metalloid. Again, a stable amorphous matrix is left behind. The precipitation of metal and the migration of metalloid (boron) are both undesirable. The narrower ranges of 15 to 25 and 18 to 22 atomic weight of metalloid cover the more thermally stable compositions.

As a first step, an amorphous alloy coating is formed by magnetron sputtering from targets containing the crystalline bulk iron or steel material (plus Al, if necessary) with boron and silicon. This can be done by conventional magnetron sputtering techniques as illustrated by the examples. A conventional electrochemical test is used to compare the amorphous alloy coating material with the crystalline material of the substrate. The examples illustrate a suitable method of testing. Because the electrochemical potentials are dependent on reaction conditions, this testing should be done under actual operational conditions where corrosion is most likely to occur. If the amorphous coating is neutral or preferably anodic in respect to the crystalline substrate material, then this first formulation will be selected. However, often the amorphous coating produced from silicon, boron and the crystalline bulk iron or steel material used in the surface or substrate to be coated will be cathodic in respect to the crystalline bulk iron or steel substrate material. The composition of the amorphous alloy coating will have to be adjusted until it becomes neutral or preferably anodic in respect to the crystalline iron or steel material.

The amorphous metal alloy coating is made anodic by adjusting the composition of its metal portion (excluding the B and Si metalloids). If the surface being protected is an iron-chromium stainless steel or casting steel, the amorphous metal alloy coating can be made anodic by reducing the chromium content by preferably from more than zero to 3 or more preferably from more than zero to 1 weight percent based on the composition of the iron-chromium stainless steel or casting steel substrate material. The amount of chromium that can be removed is further limited by the requirement that the amorphous metal alloy coating should preferably contain a minimum of 1, more preferably a minimum of 3, and still more preferably a minimum of 8 atomic percent of chromium.

The most corrosive naturally occurring environment for stainless steels is sea water. Uncoated crystalline stainless steels which are used in a sea water environment should contain at least 15 atomic percent of chromium. We have found that amorphous metal alloy coatings containing 8 atomic percent chromium are stable in a sea water environment whereas coatings containing 5 atomic percent chromium are not and corrode. Thus, the requirement that the amorphous metal alloy coating contain a minimum of 8 atomic percent chromium is critical for naval applications. Even if the stainless or cast steel contains 15 or more atomic percent chromium, an amorphous metal alloy coating according to this invention will improve its resistance to corrosion. More important, the amorphous metal alloy coatings can be used to protect stainless and cast steels containing close to as little as 8 atomic percent chromium against sea water corrosion. For crystalline metals containing less than 8 atomic percent chromium, the amorphous metal alloy coatings are still useful in protecting the metals in other environments.

If the substrate material is an iron-chromium-nickel stainless steel or casting steel, the amorphous metal alloy coating can be made anodic by reducing the nickel, the chromium, or both the nickel and chromium content by a total of preferably from more than zero to 3 and more preferably from more than zero to 1 weight percent based on the composition of the iron-chromium-nickel stainless steel or casting steel substrate material. The amount nickel is reduced in preference to chromium because chromium is valuable as a passivating agent. Again, the amount of chromium that can be removed is further limited by the requirement that the amorphous metal alloy coating should preferably contain a minimum of 1 and more preferably a minimum of 3, and still more preferably 8 atomic percent of chromium.

To produce corrosion resistant amorphous metal alloy coatings for iron or steel materials containing less than 4 weight percent chromium, a different method of formulation is used. Instead of reducing the nickel or chromium content of the iron or steel material, aluminum is added to produce an amorphous metal alloy coating that is anodic in reference to the iron or steel material to be protected. In low chromium content materials, the aluminum functions as the primary passivation agent. Enough aluminum is added to assure sufficient passivation of the coating as well as making the coating anodic. Preferably from more than zero to about 25 or more preferably from 5 to 15 percent of aluminum is added. This percentage is based upon the metal portion of the amorphous metalloid/metal coating composition. Thus amorphous corrosion resistant metalloid/metal coating is composed of from 8 to 30 atomic percent of boron, silicon, or both boron and silicon metalloids with the remainder of the alloy being the metal portion. The metal portion is composed of preferably from more than zero to about 25, or more preferably 5 to 15 weight percent of aluminum with the remainder being the iron or steel surface material being protected. The amorphous metalloid/metal alloy coating can be produce conventional vapor deposition techniques and preferably by conventional magnetron sputtering techniques.

The Example iron and steel compositions which follow are taken from *The Making, Shaping and Treating of Steel*, tenth edition (1985), edited by William T. Lankford, Jr. et al., published by the United States Steel Corporation and the Association of Iron and Steel Engineers, Library of Congress Card Number: 84-81539 and ISBN 0-930767-00-4, herein incorporated in its entirety by reference.

Preferred examples of iron-chromium stainless steels include those having the following Uniform Numbering System (UNS) numbers: S40300; S41000; S41400; S44002; S44003; S44004; S50100; S50300; S50400; S40500; S40900; S43000; S43020; S43023; S43400; S43600; S44200; and S44600 found in Tables 47-II and 47-III on pages 1334 and 1335 of *The Making, Shaping and Treating of Steel*, supra, herein incorporated by reference.

Preferred examples of iron-chromium-nickel stainless steels include those having the following Uniform Number System (UNS) numbers: S20100; S20200; S30100; S30200; S30215; S30300; S30323; S30400; S30403; S30409; S30500; S30800; S30900; S30908; S31000; S31008; S31400; S31600; S31609; S31603; S31700; S32100; S32109; N08330; S34700; S34709; S34800; S34809; S21400; S38100; S13800; S15500; S17400; S17700 found in Tables 47-I and 47-IV on pages 1334 and 1335 of *The Making, Shaping and Treating of Steel*, supra, herein incorporated by reference.

Also included in the materials which can be protected by the methods and coatings of this invention are the iron-chromium and the iron-chromium-nickel cast steels. Examples of these iron-chromium and iron-chromium-nickel cast steels include American Society for Testing and Materials (ASTM) Designation A 743-81a grades CF-8, CG-12, CF-20, CF-8M, CF-8C, CF-16F, CH-20, CK-20, CE-30, CA-15, CA-15M, CB-30, CC-50, CA-40, CF-3, CF-3M, CG-8M, CN-7M, CN-7MS, CW-12M, CY-40, CA-6NM, CD-4MCu, and CA-6N as well as ASTM Designation A297-81 grades HF, HH, HI, HK, HE, HT, HU, HW, HX, HC, HD, HL, HN, and HP found in Table 40-III on pages 1215 and 1216 of *The Making, Shaping and Treating of Steel*, supra, herein incorporated by reference. The iron-chromium cast steels are coated in the same way that the iron-chromium stainless steels are coated. Similarly, the iron-chromium-nickel cast steels are coated in the same way that the iron-chromium-nickel stainless steels are coated.

Preferred examples of carbon steels are those having Uniform Numbering System (UNS) designations G10050; G10060; G10080; G10100; G10120; G10130; G10150; G10160; G10170; G10180; G10190; G10200; G10210; G10200; G10230; G10250; G10260; G10290; G10300; G10350; G10370; G10380; G10390; G10400; G10420; G10430; G10440; G10450; G10460; G10490; G10500; G10530; G10550; G10590; G10600; G10640; G10650; G10690; G10700; G10740; G10750; G10780; G10800; G10840; G10850; G10860; G10900; and G10950 found in Table 42-I on page 1278 of *The Making, Shaping and Treating of Steel*, supra, herein incorporated by reference. Also included are the resulphurized carbon steels such as UNS numbers G11080; G11100; G11170; G11180; G11370; G11390; G11400; G11410; G11440; G11460; and G11510 as well as rephosphorized and resulphurized carbon steels such as UNS numbers G12110; G12120; G12130; G12150; and G12144 found in Table 42-II on page 1279 of *The Making, Shaping and Treating of Steel*, supra, herein incorporated by reference. Additionally included are the high-manganese carbon steels such as UNS numbers G15130; G15220; G15240; G15260; G15270; G15360; G15410; G15480; G15510; G15520; G15610; and G15660 found in Table 42-III on page 1279 of *The Making, Shaping and Treating of Steel*, supra, herein incorporated by reference. Other carbon steels may also be protected by methods and coatings of this invention.

Prefer examples of low-carbon steels include quenched and tempered low-carbon (1) constructional alloy steels such as UNS K11576, K11630, and K11646; and (2) ultraservice steels such as HY-80, HY-100, UNS K42338, and UNS K51255 found in Tables 43-III and 43-V on pages 1302 and 1303 of *The Making, Shaping and Treating of Steel*, supra, herein incorporated by reference.

Preferred examples of alloy steels include those having the following uniform Numbering System (UNS) numbers: G13300; G13350; G13400; G13450; G40230; G40240; G40270; G40280; G40320; G40370; G40420; G40470; G41180; G41300; G41350; G41370; G41400; G41420; G41450; G41470; G41500; G41610; G43200; G43400; G43406; G44220; G44270; G46150; G46170; G46200; G46260; G47180; G47200; G48150; G48170; G48200; G50401; G50441; G50460; G50461; G50501; G50600; G50601; G51150; G51170; G51200; G51300; G51320; G51350; G51400; G51470; G51500; G51550; G51600; G51601; G50986; G51986; G52986; G61180; G61500; G81150; G81451; G86150; G86170; G86200; G86220; G86250; G86270; G86300; G86370; G86400; G86420; G86450; G86451; G86500; G86550; G86600; G87200; G87400; G88220; G92540; G92600; G93106; G94151; G94171; and G94301 found in Table 43-I on pages 1290 and 1291 of *The Making, Shaping and Treating of Steel*, supra, herein incorporated by reference.

The present invention may be used to provide protective coatings for the wide variety of cast irons in use.

The general nature of the invention having been set forth, the following examples are presented as specific illustrations thereof. It will be understood that the invention is not limited to these specific examples, but is susceptible to various modifications that will be recognized by one of ordinary skill in the art.

EXAMPLE 1

Preparation

A series of metallic glass coatings of compositions 1 through 5 were fabricated on glass and aluminum foil substrates using a magnetron sputtering apparatus equipped with two Sputtered Films Inc. research S-guns. One gun was configured for DC sputtering and the other for RF sputtering. The DC target consisted of S30400 alloyed with 4.5 weight percent (w/o) boron and 3.8 w/o silicon (approximately 15 and 5 atomic percent, a/o, respectively), a composition in the middle of the easy glass forming range. The RF sputtering target was composed of unalloyed S30400. The substrates were mounted on a planetary substrate holder which rapidly passed the substrates alternately over each gun. The coatings were then produced by sputtering from both guns simultaneously. The composition of each coating was controlled by varying the power applied to (and the sputtering rate from) each gun. The resulting compositions 1 through 5 were estimated from the measured thicknesses of the coatings (see Table 1).

Another series of coatings (compositions 9 through 13) was fabricated by using a DC target of unalloyed S30400 and RF target consisting of a boron primary and a silicon secondary. Again, composition was varied by the power applied to each gun.

A third series of compositions 6 through 8 was also fabricated by using the alloyed S30400 DC target together with the boron and silicon RF target. Since the DC target alone would produce a composition that is in the middle of the easy glass-forming range, this series represents compositions with an excess of metalloid (or, equivalently, a deficiency of metal). In these cases, coating composition could not be estimated from film thickness since boron and silicon tend to occupy interstitial sites in the metallic glass. However, the relative composition could be specified by the power dissipated by each gun. The power parameters for all of the coatings are summarized in Table 1.

EXAMPLE 2

X-ray diffraction ($M_o K_a$)

Each composition was checked by x-ray diffraction (Mo $K_a$) for the presence of crystalline peaks. X-ray diffraction measurements indicate that all of the coatings containing boron and silicon were amorphous. This is illustrated in FIG. 1, which shows the diffraction patterns for the series of compositions fabricated using the DC target of S30400 and the RF target of boron and silicon. The coating made by sputtering only from the S30400 target (either DC or RF) was bodycentered cubic (BCC) rather than face-centered cubic (FCC) as in the bulk alloy. This is in agreement with previously published results. The smallest concentration of metalloid showing an amorphous diffraction pattern was 8 atomic percent (a/o).

EXAMPLE 3

Galvanic coupling tests

Electrochemical specimens were prepared by attaching copper leads to coatings deposited on 2.5 by 7.5 cm (1-inch by 3-inch) glass slides with conducting silver paint. The contact area was sealed with glyptol to prevent galvanic reactions between the copper wire, silver paint, and metallic glass coating. The coatings were coupled to a 2.5 cm (1-inch) diameter by 0.3 cm (⅛-inch) thick disc of S30400 in a 3 electrode cell with a saturated calomel reference electrode (SCE). Galvanic potential of the coating relative to the SCE and bulk steel, and corrosion current between the coating and bulk steel were measured in 0.35 weight percent (w/o) and 3.5 w/o NaCl. Potentiodynamic curves for the coatings were obtained in 3.5 w/o NaCl using a PARC 351 Corrosion Measurement System with a SCE reference and pure graphite counter-electrode. The potential was scanned between −0.5 and 1.2 volts versus the SCE. Selected specimens were annealed at various temperatures in situ and characterized by x-ray photoelectron spectroscopy (XPS).

Figure 2:
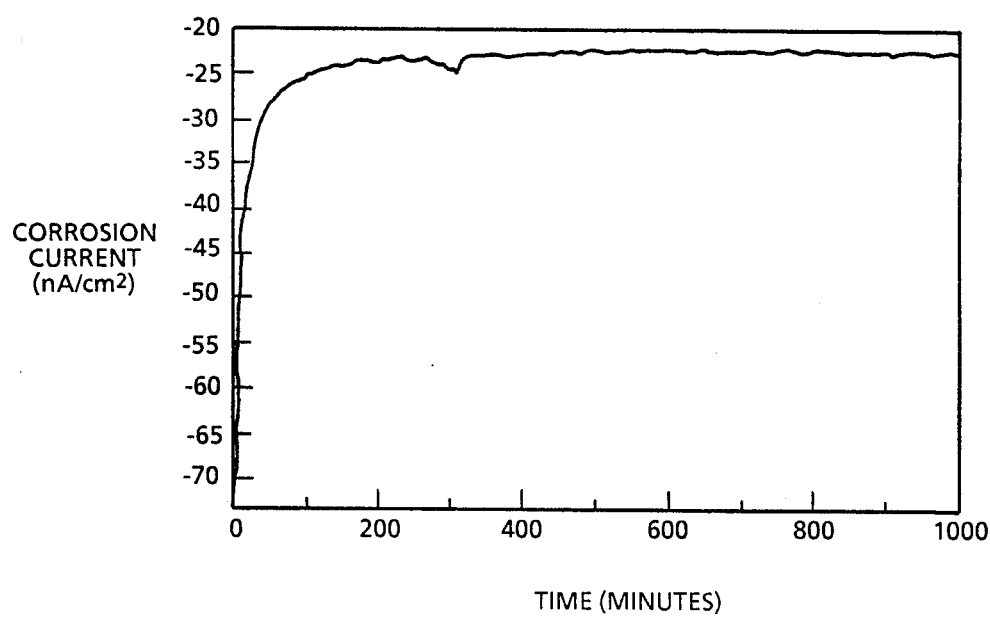
FIG. 2 shows a typical plot of corrosion current versus time for an amorphous metal alloy coating/crystalline bulk metal pair.

The galvanic coupling between the metallic glass coatings and bulk S30400 was remarkably insensitive to the concentration of boron and silicon. In every case, the potential difference was less than 0.02 volts, the limit of the reproducibility of the measurement. The direction of the corrosion current indicated that the coating was very slightly cathodic to the bulk steel. The largest coupling was found between the sputtered and bulk S30400, which are BCC and FCC, respectively. This coating was also cathodic, with $\Delta V = 0.09V$. A typical plot of corrosion current versus time is illustrated in FIG. 2. The approximately 150 minute equilibration time was typical for all of the coatings. Equilibrium corrosion currents ranged from 25 to several hundred nA/cm². Higher currents were found in coatings with poor adhesion to the substrate, which resulted in the formation of blisters (leading to crevice corrosion).

Figure 3:
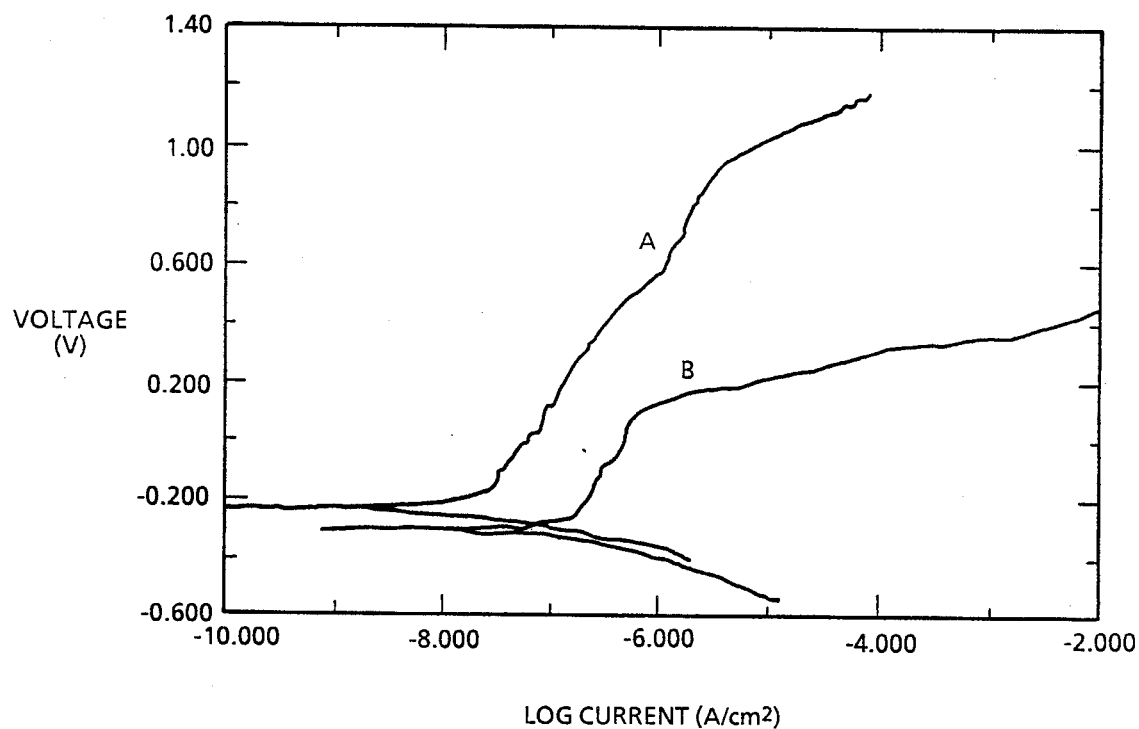
FIG. 3 shows a typical potentiodynamic curve for the amorphous metal alloy coatings and bulk USN S30400 in 3.5 weight percent Na Cl.

A typical potentiodynamic curve for the amorphous metal alloy (metallic glass) coatings in 3.5 w/o NaCl is illustrated in FIG. 3. A similar curve for bulk S30400 is also shown for comparison. The coating is significantly better than the bulk steel, both in terms of the general open circuit corrosion rate and resistance to pitting.

These results indicate that rendering the bulk steel amorphous by the addition of boron and silicon followed by sputtering has only a slight effect on the galvanic potential. While the resulting coatings are slightly cathodic to the bulk material, this can be modified by altering the relative amounts of iron, nickel, and chromium in or by adding aluminum to the metallic glass (amorphous metal alloy).

TABLE 1

| COMPOSITION NUMBER | DC TARGET | POWER (W) | RF TARGET | POWER (W) | BORON (W/O) | SILICON (W/O) |
|---|---|---|---|---|---|---|
| 1 | S30400 + 4.5% B + 3.8% Si | 500 | S30400 | 0 | 4.8 | 3.5 |
| 2 | | 400 | | 200 | 3.5 | 2.6 |
| 3 | | 300 | | 300 | 2.8 | 2.0 |
| 4 | | 200 | | 400 | 1.9 | 1.4 |
| 5 | | 0 | | 500 | 0 | 0 |
| 6 | S30400 + 4.5% B + 3.8% Si | 510 | B + Si | 350 | — | — |

TABLE 1-continued

| COMPOSITION NUMBER | DC TARGET | POWER (W) | RF TARGET | POWER (W) | BORON (W/O) | SILICON (W/O) |
|---|---|---|---|---|---|---|
| 7 | | 500 | | 450 | 10.68 | 24.10 |
| 8 | | 500 | | 550 | — | — |
| 9 | S30400 | 410 | B + Si | 275 | — | — |
| 10 | | 510 | | 275 | — | — |
| 11 | | 510 | | 700 | — | — |
| 12 | | 500 | | 400 | — | — |
| 13 | | 500 | | 500 | — | — |

TABLE 2

| ELEMENT* | UN-ANNEALED | ANNEALED 500° C. | ANNEALED 600° C. |
|---|---|---|---|
| Si | 24.10 | 21.95 | 20.36 |
| B | 10.68 | 10.18 | 10.52 |
| Cr | 13.98 | 23.65 | 30.59 |
| Mn | 4.50 | 3.85 | 4.86 |
| Fe | 44.50 | 39.27 | 32.66 |
| Ni | 2.25 | 1.10 | 1.02 |

*oxygen, nitrogen, and carbon have been excluded.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent is:

1. A coated object comprising:
   A. a structure having an exposed surface of a crystalline metal material which is a cast iron, a carbon steel, a low carbon steel, an alloy steel, or a low-alloy steel, and
   B. an amorphous metal alloy coating covering the exposed surface and having a composition of
      (1) from 8 to 30 atomic percent of a metalloid which is boron, silicon, or mixtures thereof, and
      (2) the remainder being a modified metal composition formed by replacing from more than zero to 25 weight percent of the crystalline metal material with aluminum;
   wherein the amorphous metal alloy coating is formed from the metalloid and the modified metal composition by vapor deposition and wherein the amorphous metal alloy coating is anodic in reference to the crystalline metal material in the environment of use.

2. The coated object of claim 1 wherein the amorphous metal alloy coating is formed by cathode magnetron sputtering.

3. The coated object of claim 2 wherein separate targets are used for the crystalline metal, the metalloid, and the aluminum.

4. The coated object of claim 1 wherein the crystalline metal material is a cast iron.

5. The coated object of claim 1 wherein the crystalline metal material is a carbon steel.

6. The coated object of claim 1 wherein the crystalline metal alloy material is a low alloy.

7. The coated object of claim 1 wherein the metalloid comprises from 15 to 25 atomic percent of the amorphous metal alloy coating.

8. The coated object of claim 7 wherein the metalloid comprises from 18 to 22 atomic percent of the amorphous metal alloy coating.

9. The coated object of claim 1 wherein the modified metal material is formed by replacing from 5 to 15 weight percent of the crystalline metal material with aluminum.

10. The coated object of claim 1 wherein the amorphous metal alloy coating is anodic in reference to the crystalline metal is sea water.

11. A coated object comprising:
   A. a structure having an exposed surface composed of a crystalline iron chromium steel comprising at least 4 weight percent chromium, and
   B. an amorphous metal alloy coating covering the exposed surface and having a composition of
      (1) from 8 to 30 atomic percent of a metalloid which is boron, silicon, or mixtures thereof, and
      (2) the remainder being a modified iron-chromium composition formed by reducing the chromium content of the crystalline iron-chromium steel by from more than zero to 3 weight percent,
   provided that the amorphous metal coating contains at least 1 atomic percent chromium and is formed from the metalloid and the modified iron-chromium composition by vapor deposition and wherein the amorphous metal alloy coating is anodic in reference to the crystalline iron-chromium steel in the environment of use.

12. The coated object of claim 11 wherein the amorphous metal alloy coating is formed by cathode magnetron sputtering.

13. The coated object of claim 11 wherein the metalloid comprises from 15 to 25 atomic percent of the amorphous metal alloy coating.

14. The coated object of claim 13 wherein the metalloid comprises form 18 to 22 atomic percent of the amorphous metal alloy coating.

15. The coated object of claim 11 wherein the modified iron-chromium composition is formed from the crystalline iron-chromium steel by reducing the chromium content of the crystalline iron-chromium steel by from more than zero to 1 weight percent.

16. The coated object of claim 11 wherein the amorphous metal alloy coating contains a minimum of 3 atomic percent chromium.

17. The coated object of claim 16 wherein the amorphous metal alloy coating contains a minimum of 8 atomic percent chromium.

18. The coated object of claim 11 wherein the amorphous metal alloy coating is anodic in reference to the crystalline iron-chromium steel in sea water.

19. A coated object comprising:
   A. a structure having an exposed surface composed of a crystalline iron-chromium-nickel steel comprising at least 4 weight percent chromium, and
   B. an amorphous metal alloy coating covering the exposed surface and having a composition of
      (1) from 8 to 30 atomic percent of a metalloid which is boron, silicon, or mixtures thereof, and (2) the remainder being a modified iron-chromium-nickel material being formed by reducing the chromium content, the nickel content, or both of the iron-chromium-nickel steel by a total of from more than zero to 3 weight percent, provided that the amorphous metal alloy coating contains a minimum of 1 atomic percent chromium and is formed from the metalloid and the modified iron-chromium-nickel composition by vapor deposition and wherein the amorphous metal alloy coating is anodic in reference to the crystalline iron-chromium-nickel steel in the environment of use.

20. The coated object of claim 19 wherein the amorphous metal alloy coating is formed by cathode magnetron sputtering.

21. The coated object of claim 19 wherein the metalloid comprises from 15 to 25 atomic percent of the amorphous metal alloy coating.

22. The coated article of claim 23 wherein the metalloid comprises form 18 to 22 atomic percent of the amorphous metal alloy coating.

23. The coated object of claim 19 wherein the modified iron-chromium-nickel material is formed from the crystalline iron-chromium-nickel steel by reducing only the nickel content.

24. The coated object of claim 19 wherein the modified iron-chromium-nickel material is formed from the iron-chromium-nickel stainless steel by reducing the chromium content, the nickel content, or both the nickel and chromium contents of the iron-chromium-nickel steel by a total of from more than zero to 1 weight percent.

25. The coated object of claim 19 wherein the amorphous metal alloy coating contains a minimum of 3 atomic percent chromium.

26. The coated object of claim 25 wherein the amorphous metal alloy coating contains a minimum of 8 atomic percent chromium.

27. The coated object of claim 19 wherein the amorphous metal alloy coating is anodic in reference to the crystalline iron-chromium-nickel steel in sea water.

* * * * *